US008987863B2

(12) United States Patent
Krishnan et al.

(10) Patent No.: US 8,987,863 B2
(45) Date of Patent: *Mar. 24, 2015

(54) ELECTRICAL COMPONENTS FOR MICROELECTRONIC DEVICES AND METHODS OF FORMING THE SAME

(71) Applicant: Micron Technology, Inc., Boise, ID (US)

(72) Inventors: Rishikesh Krishnan, Boise, ID (US); F. Daniel Gealy, Kuna, ID (US); Vidya Srividya, Plano, TX (US); Noel Rocklein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/903,364

(22) Filed: May 28, 2013

(65) Prior Publication Data

US 2013/0258550 A1    Oct. 3, 2013

Related U.S. Application Data

(60) Division of application No. 13/171,320, filed on Jun. 28, 2011, now Pat. No. 8,450,173, which is a continuation of application No. 12/502,630, filed on Jul. 14, 2009, now Pat. No. 7,968,969, which is a continuation of application No. 11/431,958, filed on May 10, 2006, now Pat. No. 7,560,392.

(51) Int. Cl.
*H01L 21/02* (2006.01)
*H01G 4/255* (2006.01)
(Continued)

(52) U.S. Cl.
CPC .......... *H01G 4/255* (2013.01); *H01L 27/10852* (2013.01); *H01L 28/65* (2013.01)
USPC ............. 257/532; 257/E27.071; 257/E21.009

(58) Field of Classification Search
CPC ......... H01L 28/65; H01L 28/40; H01L 28/60; H01L 28/75; H01G 6/255

USPC ................. 257/68, 71, 296, 301, 303, 532, 257/E27.071, E21.01, E21.009; 438/388, 438/785; 361/305, 311

See application file for complete search history.

(56) References Cited

U.S. PATENT DOCUMENTS 5,668,040 A    9/1997    Byun et al.
6,218,258 B1    4/2001    Joo
(Continued)

FOREIGN PATENT DOCUMENTS

JP    02018895 A    1/1990
JP    2000174226 A    6/2000

OTHER PUBLICATIONS

Search Report and Written Opinion for International Application No. PCT/US2007/067942, Oct. 18, 2007, 10 pages.
(Continued)

*Primary Examiner* — Tucker Wright
(74) *Attorney, Agent, or Firm* — Perkins Coie LLP

(57) ABSTRACT

Electrical components for microelectronic devices and methods for forming electrical components. One particular embodiment of such a method comprises depositing an underlying layer onto a workpiece, and forming a conductive layer on the underlying layer. The method can continue by disposing a dielectric layer on the conductive layer. The underlying layer is a material that causes the dielectric layer to have a higher dielectric constant than without the underlying layer being present under the conductive layer. For example, the underlying layer can impart a structure or another property to the film stack that causes an otherwise amorphous dielectric layer to crystallize without having to undergo a separate high temperature annealing process after disposing the dielectric layer onto the conductive layer. Several examples of this method are expected to be very useful for forming dielectric layers with high dielectric constants because they avoid using a separate high temperature annealing process.

14 Claims, 6 Drawing Sheets

(51) Int. Cl.
*H01L 27/108* (2006.01)
*H01L 49/02* (2006.01)

(56) References Cited

U.S. PATENT DOCUMENTS

| | | |
|---|---|---|
| 6,326,316 B1 | 12/2001 | Kiyotoshi et al. |
| 6,492,241 B1 | 12/2002 | Rhodes et al. |
| 7,560,392 B2 | 7/2009 | Krishnan et al. |
| 7,968,969 B2 | 6/2011 | Krishnan et al. |
| 2001/0024849 A1 | 9/2001 | Lin et al. |
| 2001/0043453 A1 | 11/2001 | Narwankar et al. |
| 2002/0074582 A1 | 6/2002 | Hiratani et al. |
| 2003/0027393 A1 | 2/2003 | Suguro |
| 2003/0062558 A1 | 4/2003 | Yang et al. |
| 2003/0129306 A1 | 7/2003 | Wade et al. |
| 2003/0216017 A1 | 11/2003 | Drab et al. |
| 2006/0086952 A1 | 4/2006 | Kim et al. |
| 2007/0001241 A1 | 1/2007 | Lim et al. |
| 2007/0042540 A1 | 2/2007 | Lee |
| 2011/0254129 A1 | 10/2011 | Krishnan et al. |

OTHER PUBLICATIONS

Office Action issued Feb. 23, 2011 in Taiwan Application No. 096116503, 7 pages.
Examination Report issued Jan. 25, 2011 in European Application No. 07761689.4, 5 pages.
Office Action issued Jun. 5, 2012 in Japan Application No. 2009-510032, 4 pages.

ELECTRICAL COMPONENTS FOR MICROELECTRONIC DEVICES AND METHODS OF FORMING THE SAME

CROSS-REFERENCE TO RELATED APPLICATIONS

This application is a divisional of U.S. application Ser. No. 13/171,320 filed Jun. 28, 2011, now U.S. Pat. No. 8,450,173, which is a continuation of U.S. application Ser. No. 12/502,630, filed Jul. 14, 2009, now U.S. Pat. No. 7,968,969, which is a continuation of U.S. application Ser. No. 11/431,958, filed May 10, 2006, now U.S. Pat. No. 7,560,392, each of which is incorporated herein by reference in its entirety.

TECHNICAL FIELD

The present invention relates to the design and manufacture of electrical components for microelectronic devices, and several examples of the invention specifically relate to metal-insulator-metal capacitors for memory devices.

BACKGROUND

Dynamic Random Access Memory (DRAM) devices have memory cells with a field effect transistor and a capacitor. High capacity DRAM devices typically use a non-planar capacitor structure, such as a trench capacitor or a stacked capacitor. Although non-planar capacitor structures typically require more masking, depositing, and etching processes than planar capacitor structures, most high capacity DRAM devices use non-planar capacitors. In both non-planar and planar capacitors, a metal-insulator-metal (MIM) structure provides higher capacitance to enable higher density devices. Typical MIM capacitors have top and bottom conducting layers separated by a dielectric layer. The top and bottom conducting layers, which are also referred to as electrodes or plates, can be composed of the same material or different materials. One aspect of fabricating MIM capacitors is providing a dielectric layer having a high dielectric constant so that more charge can be stored in a capacitor for a given thickness of the dielectric layer. Another parameter of fabricating MIM capacitors is providing a sufficiently thick dielectric layer to mitigate or eliminate current leakage. In general, it is desirable to use a dielectric layer with a high dielectric constant to enable small capacitors to store the same amount of charge with low leakage levels as relatively large capacitors.

Tantalum oxide is one promising material for forming dielectric layers in MIM capacitors. In existing capacitors, a first electrode of ruthenium is deposited directly onto a plug located over diffusion regions. A dielectric layer of amorphous tantalum oxide is then deposited onto the ruthenium layer using a vapor deposition process at 300-450° C. The amorphous tantalum oxide has a dielectric constant of about 18-25. To increase the dielectric constant of the tantalum oxide layer to about 40-50, it is subsequently crystallized using a separate high temperature process above 300° C. (e.g., typically between 600-800° C.). Such additional high temperature processing to crystallize the tantalum oxide, however, may impact the thermal budget of manufacturing the microelectronic devices. For example, high temperature processes are typically avoided to prevent destabilization of the films, diffusion of dopants/implants, and generation of undesirable stresses in film stacks. High temperature annealing processes are also avoided because they would require additional time-consuming procedures that must be integrated into the fabrication process. Therefore, it would be desirable to form a tantalum oxide dielectric layer with a high dielectric constant without annealing the tantalum oxide at a high temperature in a separate process after it has been deposited.

DETAILED DESCRIPTION

A. Overview

Figure 1:
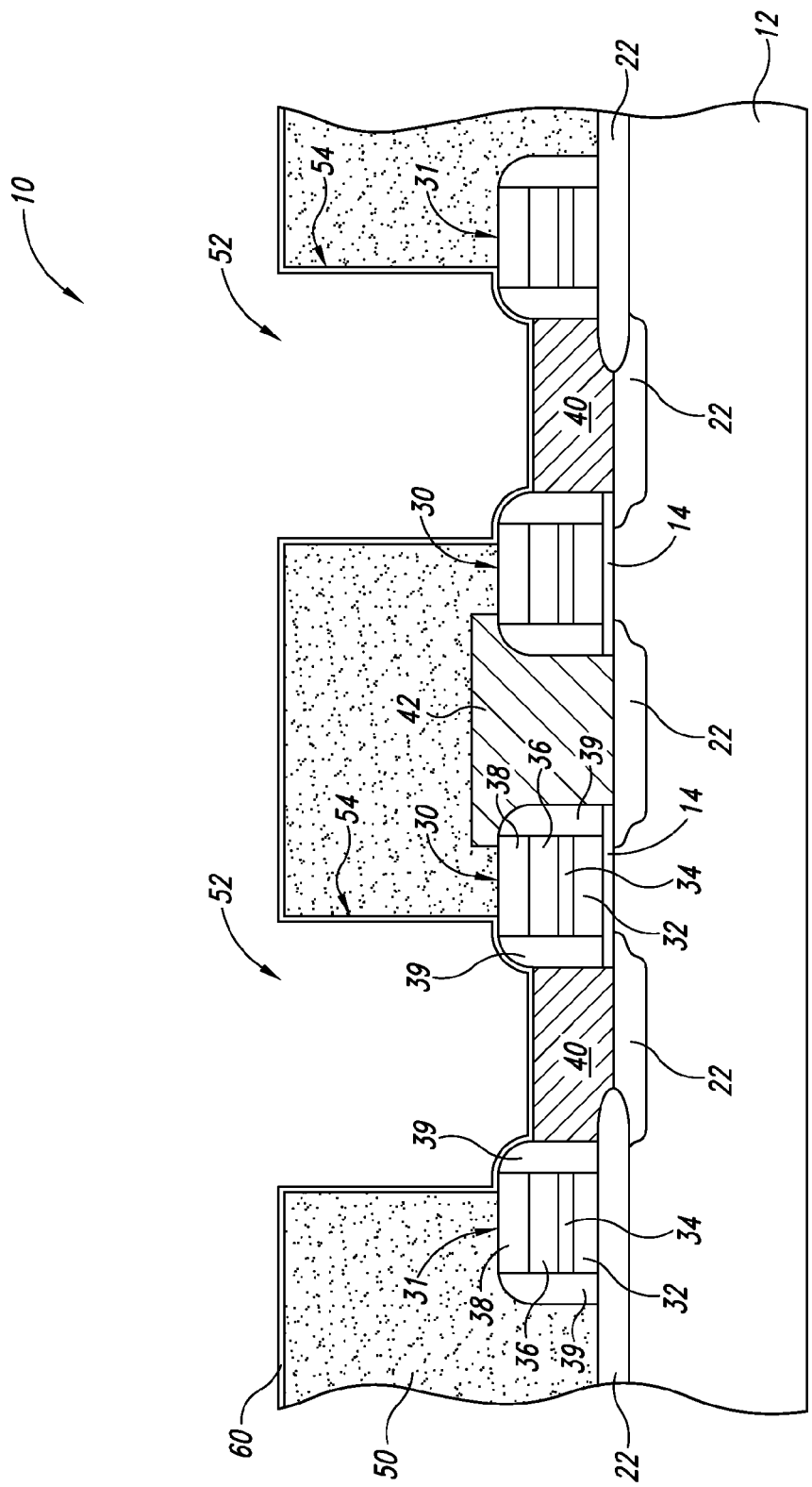
FIG. 1 is a cross-sectional view schematically illustrating a portion of a microelectronic workpiece at a stage of a method in accordance with an embodiment of the invention.

The present invention is directed toward electrical components for microelectronic devices and methods for forming electrical components. One particular embodiment of such a method comprises depositing an underlying layer onto a workpiece, and forming a conductive layer on the underlying layer. The method can continue by depositing a dielectric layer on the conductive layer. The underlying layer is a material that causes the dielectric layer to have a higher dielectric constant than without the underlying layer being present under the conductive layer. For example, the underlying layer can impart a structure or another property to the film stack that causes an otherwise amorphous dielectric layer to crystallize without having to undergo a separate high temperature annealing process after depositing the dielectric material onto the conductive layer. Several examples of this method are expected to be very useful for forming dielectric layers with high dielectric constants because they avoid using a separate high temperature annealing process.

Another example of a method in accordance with the invention is directed toward forming a capacitor for a memory device or another type of microelectronic device. This method includes providing a workpiece having a capacitor region and depositing an underlying layer over at least a portion of the capacitor region. This method can further include forming a first conductive layer on the underlying layer to form a first electrode in the capacitor region, and depositing a tantalum oxide layer in the capacitor region on the first conductive layer. The underlying layer is composed of a material or otherwise has a property that causes the tantalum oxide layer on the first conductive layer to have a higher dielectric constant than without the underlying layer being present under the first conductive layer. This embodiment can further include forming a second conductive layer on the tantalum oxide layer to form a second electrode. In a specific example, the second conductive layer is deposited onto the tantalum oxide layer without crystallizing the tantalum oxide layer in a separate annealing process after the tantalum oxide layer has been disposed onto the first conductive layer.

Another method of forming an electrical component for a microelectronic device in accordance with a different embodiment of the invention comprises depositing a liner onto a portion of a workpiece, forming a conductive layer on the liner, and depositing a dielectric layer on the conductive layer. In this embodiment, the dielectric layer has a higher dielectric constant when the liner is under the conductive layer than when the liner is not under the conductive layer without exposing the dielectric layer to an environment above approximately 300° C. after depositing the dielectric layer on the conductive layer.

Still another embodiment of a method in accordance with the invention is directed toward forming a capacitor by providing a workpiece having a depression including a sidewall and depositing a liner to at least partially cover the sidewall of the depression. This embodiment further includes forming a first conductive layer on the liner in the depression to form a first electrode, depositing a tantalum oxide layer in the depression on the first conductive layer, and forming a second conductive layer on the tantalum oxide layer to form a second electrode. The liner is a material that causes the tantalum oxide layer to have a dielectric constant of at least approximately 40 without crystallizing the tantalum oxide layer in a separate process at a temperature above approximately 300° C. after depositing the tantalum oxide in the depression.

Other aspects of the invention are directed toward apparatus, such as components for microelectronic devices and systems that include such components. For example, one embodiment of the invention is directed toward a component for a microelectronic device that comprises an electrically conductive element having a first side and a second side, a dielectric layer in contact with the first side of the electrically conductive element, and a liner in contact with at least a portion of the second side of the electrically conductive element. The liner is a material that causes the dielectric layer to have a higher dielectric constant than without the liner contacting the second side of the electrically conductive element. In one particular example of this embodiment, the liner comprises a silicate (e.g., $ZrSi_xO_y$ and/or $HfSi_xO_y$), a complex oxide (e.g., $HfAl_xO_y$ and/or $ZrAl_xO_y$), or other suitable materials that impart the desired crystallization or other dielectric properties to the dielectric layer without annealing the dielectric layer after it has been deposited. In this example, the electrically conductive layer can be composed of Ruthenium (Ru), Ruthenium Oxide ($RuO_2$), Platinum (Pt), Platinum Rhodium (PtRh), or other suitable metals with a suitable crystal structure that when deposited onto the liner provide a stratum to impart the high dielectric constant to the dielectric layer. In this example, the dielectric layer can be tantalum oxide ($Ta_2O_5$) deposited directly onto the electrically conductive element. In a film stack including a liner comprising amorphous $HfSi_xO_y$ or amorphous $HfAl_xO_y$, an electrically conductive element comprising ruthenium, and a dielectric layer comprising tantalum oxide, a significant increase in the crystallization of the tantalum oxide dielectric layer occurs without subsequently annealing the tantalum oxide layer in a high temperature process (e.g., above 300° C.). Such crystallization of the tantalum oxide is expected to cause the dielectric layer to have a higher dielectric constant compared to when the liner is not present on the other side of the ruthenium layer.

Many specific details of certain embodiments of the invention are described below with reference to FIGS. 1-6 to provide a thorough understanding of these embodiments. A person skilled in the art, however, will understand that the invention may be practiced without several of these details or additional details can be added to the invention. For example, although the following examples of the methods and apparatus in accordance with the invention are explained in the context of a capacitor for a memory cell of a DRAM device, the invention can be applied to other types of electrical components in other types of devices (e.g., flash-memory devices or other components that benefit from dielectric layers with high-dielectric constants).

B. Embodiments of Electrical Components and Methods of Forming Electrical Components FIG. 1 is a cross-sectional view illustrating a portion of a workpiece 10 at a stage of forming a capacitor of a DRAM device in accordance with an embodiment of the invention. At this stage, the workpiece 10 includes a substrate 12 having gate oxide regions 14 and source/drain diffusion regions 22. The workpiece 10 further includes a plurality of gate stacks 30 and 31 associated with the gate oxide regions 14 and/or the diffusion regions 22. The gates stacks 30 and 31 include an oxide layer 32, a doped polysilicon layer 34, a silicide region 36, and an insulating cap 38. Each gate stack further includes dielectric sidewall spacers 39. In the example shown in FIG. 1, the gate stacks 30 and the corresponding diffusion regions 22 form access transistors for memory cells. The doped polysilicon layers 34 of the gate stacks 30, more specifically, are word lines for the memory device. The workpiece 10 further includes conductive plugs 40 between a pair of adjacent gate stacks 30 and 31, and conductive plugs 42 between adjacent gates stack 30.

The workpiece 10 further includes an insulating layer 50 having a plurality of holes 52 aligned with the conductive plugs 40. The insulating layer 50 can be borophosphosilicate glass (BPSG) or another suitable dielectric material. The holes 52 are typically patterned and etched through the insulating layer 50 to expose the upper surface of the conductive plugs 40. The holes 52 accordingly have sidewalls 54 through the insulating layer 50. The diffusion regions 22, gate stacks 30 and 31, plugs 40 and holes 52 shown in FIG. 1 are one example of an environment in which electrical components in accordance with the invention can be used. As such, other examples of the invention may not include such structures.

In this embodiment, an initial stage of forming a capacitor comprises depositing an underlying layer 60 onto the workpiece 10. The underlying layer 60 shown in FIG. 1 is a liner that covers at least a substantial portion of the sidewalls 54, spacers 39, and/or the plugs 40. In several preferred examples of methods in accordance with the invention, the underlying layer 60 comprises silicates, oxides, and/or other materials. Suitable silicates for the underlying layer 60 include hafnium silicate ($HfSi_xO_y$) and/or zirconium silicate ($ZrSi_xO_y$). Suitable oxides include hafnium oxide, hafnium aluminum oxide ($HfAl_xO_y$) and/or zirconium aluminum oxide ($ZrAl_xO_y$). When the underlying layer 60 is hafnium silicate or hafnium aluminum oxide, it is generally deposited using a vapor deposition process, such as chemical vapor deposition or atomic layer deposition, at a temperature of approximately 300-450° C. As discussed in more detail below, when the underlying layer 60 is composed of such silicates or complex oxides, it imparts a higher dielectric constant to a tantalum oxide dielectric layer that is deposited onto a conductive layer that covers the underlying layer 60. The underlying layer 60, however, is not limited to these compounds.

Figure 2:
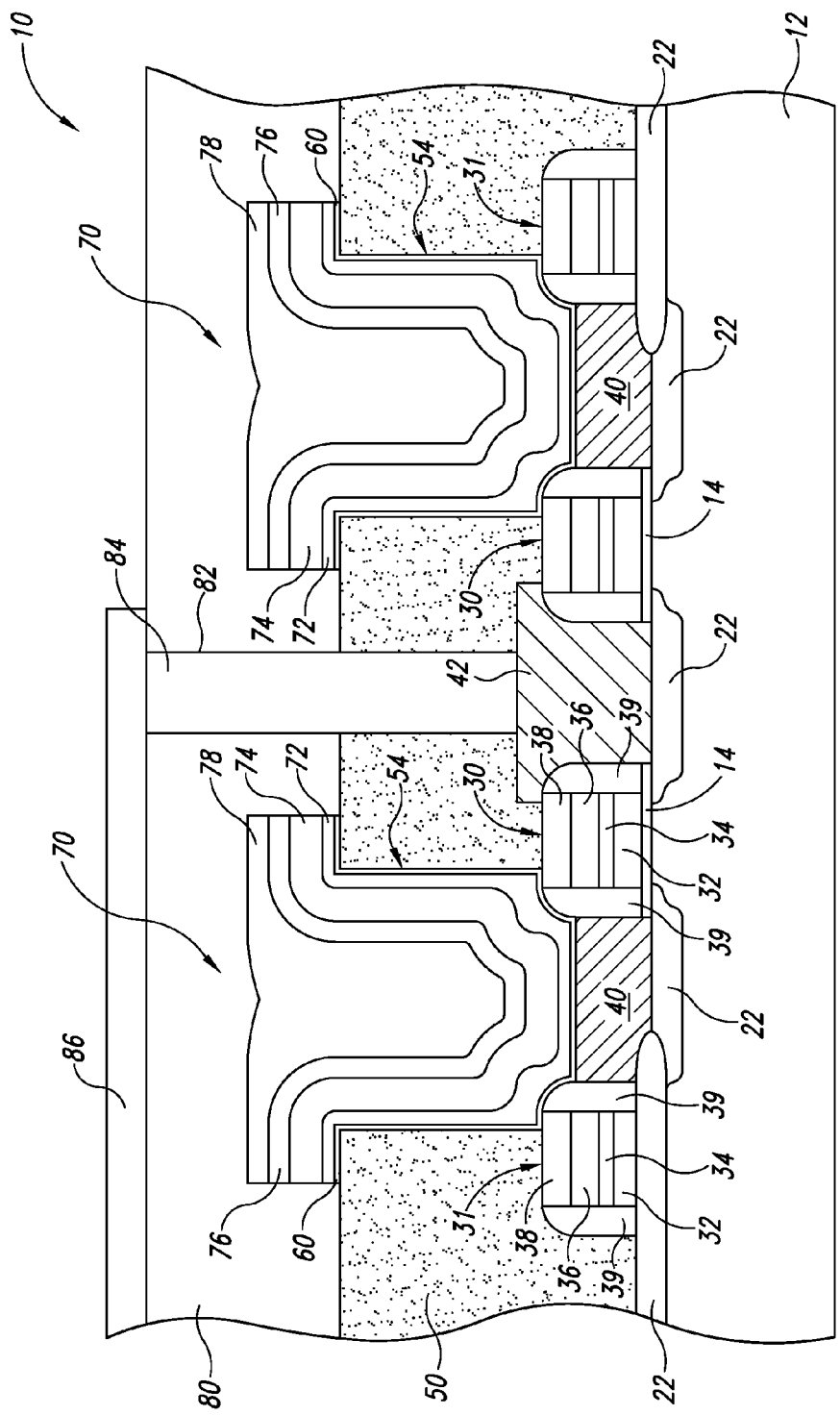
FIG. 2 is a cross-sectional view of an electrical component formed on the microelectronic workpiece of FIG. 1 at a later stage of a method in accordance with an embodiment of the invention.

FIG. 2 is a cross-sectional view showing the workpiece 10 after constructing capacitors 70 in corresponding holes 52 (FIG. 1). The capacitors 70 include the underlying layer 60 along the sidewalls 54 and over the spacers 39 and/or the plugs 40. The capacitors 70 further include a first conductive layer 72 on the underlying layer 60, a dielectric layer 74 on the first conductive layer 72, and a second conductive layer 76 on the dielectric layer 74. In the case of a capacitor, the dielectric layer 74 is a dielectric spacer that can hold a charge for a period of time. The capacitor 70 can further include an insulator layer 78 over the second conductive layer 76.

The first conductive layer 72 forms a first electrode or bottom electrode. The first conductive layer 72 can comprise Ruthenium (Ru), Platinum (Pt), Paladium (Pd), Chromium (Cr), Molybdenum (Mo), Rhemium (Re), Iridium (Ir), Tantalum (Ta), Titanium (Ti), Vanadium (V), Niobium (Nb), and Tungsten (W), and/or their conductive alloys, oxides, suboxides, nitrides, subnitrides, silicides, silicates and carbides. In a specific example, the first conductive layer 72 comprises ruthenium. The second conductive layer 76 is a second electrode or top electrode. The second conductive layer 76 can comprise Ruthenium (Ru), Platinum (Pt), Rhodium (Rh), Paladium (Pd), Chromium (Cr), Molybdenum (Mo), Rhemium (Re), Titanium (Ti), Vanadium (Va), Niobium (Nb), Tungsten (W), and Tantalum (Ta), and/or their conductive alloys, oxides, suboxides, nitrides, subnitrides, silicides, silicates, and carbides.

The dielectric layer 74 generally comprises a material having a dielectric constant of at least approximately 40 when deposited onto the first conductive layer 72 without being annealed or otherwise processed at a temperature above approximately 300° C. after being deposited. For example, the dielectric layer 74 preferably comprises tantalum oxide ($Ta_2O_5$). Such a tantalum oxide dielectric layer 74 can be deposited onto the first conductive layer 72 using a vapor deposition process at approximately 300-450° C. One aspect of several embodiments of the invention is that the dielectric layer 74 normally does not have the desired dielectric constant of approximately 40-50 without being annealed unless the underlying layer 60 is under the first conductive layer 72. The dielectric layer 74, for example, can have an amorphous structure with a dielectric constant less than 40 when it is deposited onto the first conductive layer 72 without the underlying layer 60 contacting the opposing surface of the first conductive layer 72, but the dielectric layer 74 can have a crystalline structure with a dielectric constant not less than 40 with the underlying layer 60 contacting the opposing surface of the first conductive layer 72 without using a separate high temperature process to crystallize the dielectric layer 74 after it has been deposited. As such, it is not the material or the post-deposition processing of the dielectric layer 74 itself that provides the high dielectric constant, but rather the combination of the underlying layer 60 with the first conductive layer 72 and/or the dielectric layer 74 that imparts a high dielectric constant to the dielectric layer 74.

In one specific example of the invention, the underlying layer 60 comprises hafnium oxide ($HfO_2$), hafnium silicate ($HfSi_xO_y$) or hafnium aluminum oxide ($HfAl_xO_y$), the first conductive layer 72 comprises ruthenium (Ru), and the dielectric layer 74 comprises tantalum oxide ($Ta_2O_5$). If the hafnium silicate or hafnium aluminum oxide underlying layer 60 was not present, the vapor deposited tantalum oxide dielectric layer 74 would be amorphous and have a dielectric constant of approximately 18-25. However, when the hafnium silicate or hafnium aluminum oxide layer 60 is under the ruthenium first conductive layer 72, the tantalum oxide dielectric layer 74 crystallizes without undergoing a separate high temperature annealing process after it has been deposited. Such crystallization of the tantalum oxide dielectric layer 74 using an $HfSi_xO_y$ or $HfAl_xO_y$ liner under the ruthenium conductive layer 72 causes the tantalum oxide dielectric layer 74 to have a higher dielectric constant compared to a tantalum oxide layer that is deposited onto a ruthenium conductive layer without the underlying layer 60 being present. In many cases, the tantalum oxide dielectric layer 74 has a dielectric constant of approximately 50 without undergoing a separate annealing process when the first conductive layer 72 is ruthenium and the underlying layer 60 is $HfO_2$, $HfSi_xO_y$, or $HfAl_xO_y$.

One expected advantage of several examples of electrical components in accordance with the invention is that the dielectric layer 74 has a high dielectric constant without having to subject the workpiece to a separate annealing process after depositing the dielectric layer 74. As explained above, existing processes anneal tantalum oxide dielectric layers at a temperature of between approximately 300-800° C. after the tantalum oxide layers have been deposited to change the tantalum oxide from being amorphous with a dielectric constant of 18-25 to being crystalline with a dielectric constant of approximately 50. Unlike existing systems, several examples of the present invention use the underlying layer 60 under the first conductive layer 72 to cause dielectric layer 74 to have a high dielectric constant without having to undergo a separate annealing process or other high temperature process. As such, several embodiments of the present invention provide a dielectric layer with a high dielectric constant and mitigate or eliminate concerns regarding film stability, dopant diffusion, and activation/deactivation issues associated with high temperature annealing processes currently used to form crystalline tantalum oxide.

The workpiece 10 can undergo further processing to complete the memory cells on the workpiece. For example, the workpiece 10 can further include another dielectric layer 80 deposited over the insulator layer 50 and the capacitors 70. The dielectric layer 80 can have a hole 82 extending down to the plug 42, a conductor 84 in the hole 82, and an electrically conductive bit line 86 connected to the conductor 84. Accordingly, the electrically conductive bit line 86 is electrically connected to the active region 22 under the plug 42. The array and the peripheral circuitry are then completed using techniques known in the art.

Figure 3:
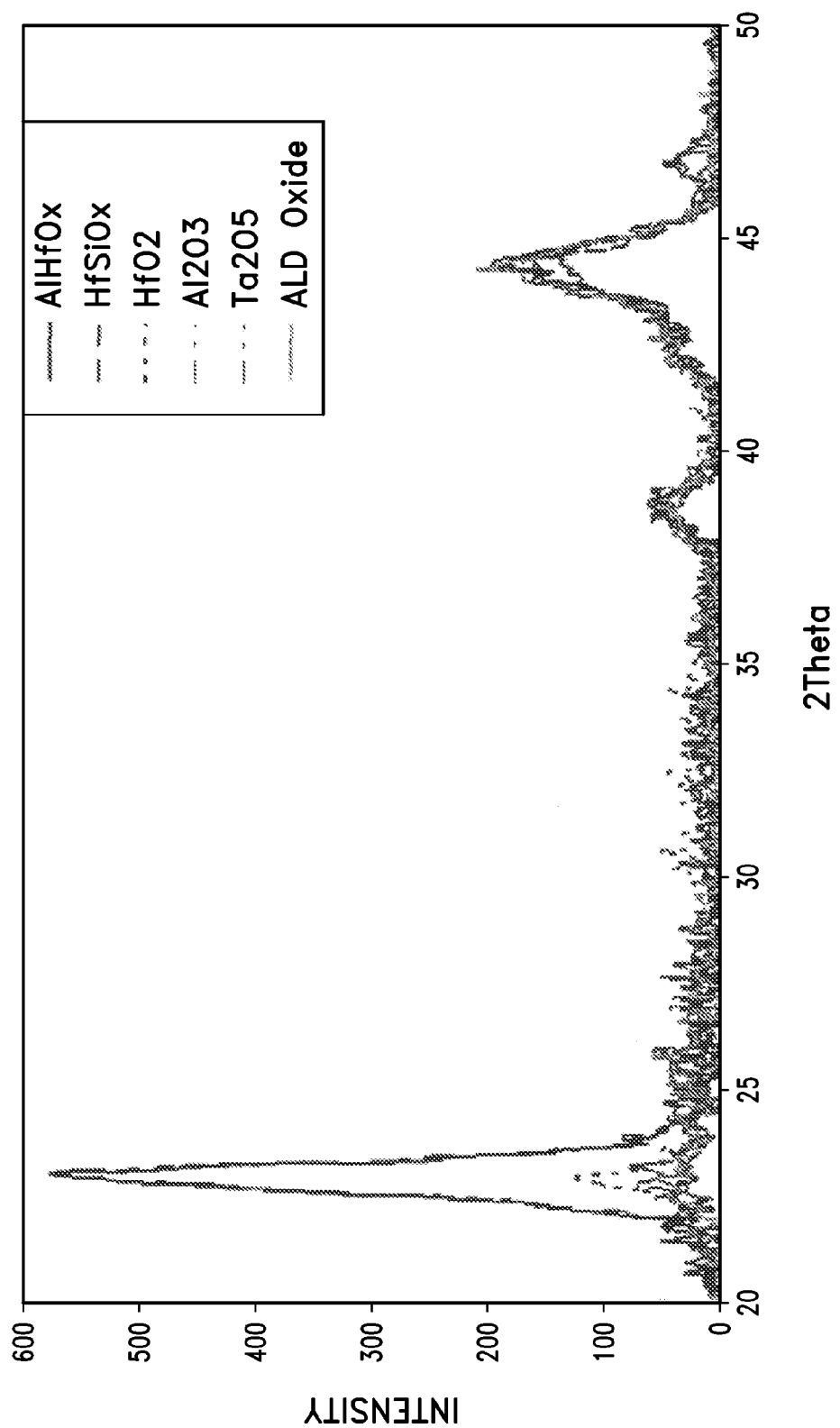
FIG. 3 is a graph illustrating properties of materials for underlying layers in accordance with an embodiment of the invention.

FIG. 3 is a graph of grazing angle incident X-ray diffraction (GIXRD) data that shows the material of the liner plays an important role in tantalum oxide crystallization. In FIG. 3, when amorphous silicon oxide, amorphous tantalum oxide, or amorphous aluminum oxide are used as liners, no crystallization of a tantalum oxide layer on top of the conductive ruthenium layer was observed without subsequent high temperature processing. When ruthenium was deposited on amorphous hafnium oxide liners, only a small amount of crystallization of the tantalum oxide layer occurred. However, a significant amount of crystallization occurred in the tantalum oxide layer when the ruthenium was deposited on amorphous hafnium silicate or amorphous hafnium aluminum oxide liners without additional high temperature processing after depositing the tantalum oxide layer.

Figure 4:
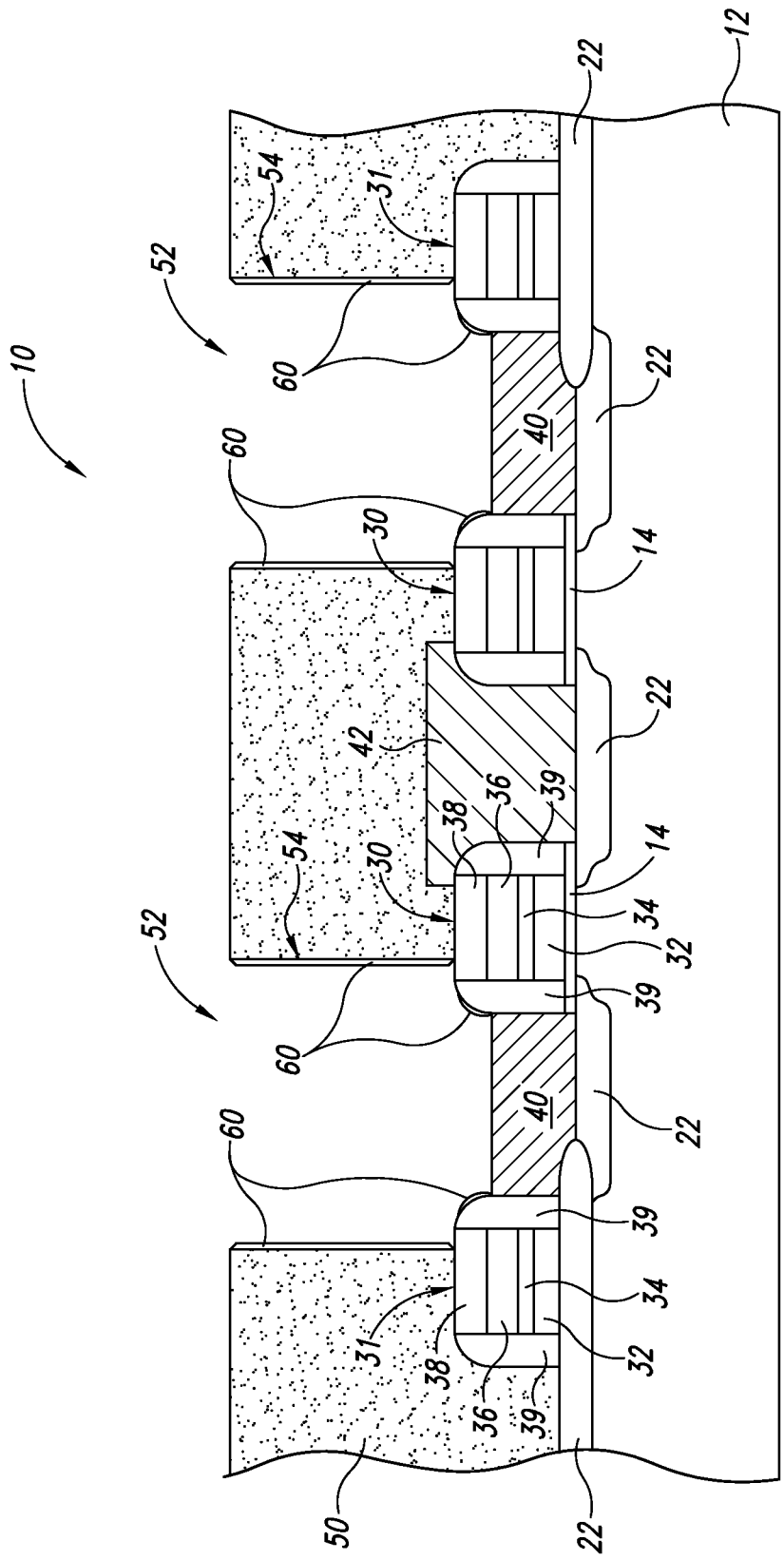
FIG. 4 is a cross-sectional view schematically illustrating a portion of a microelectronic workpiece at a stage of a method in accordance with another embodiment of the invention.
Figure 5:
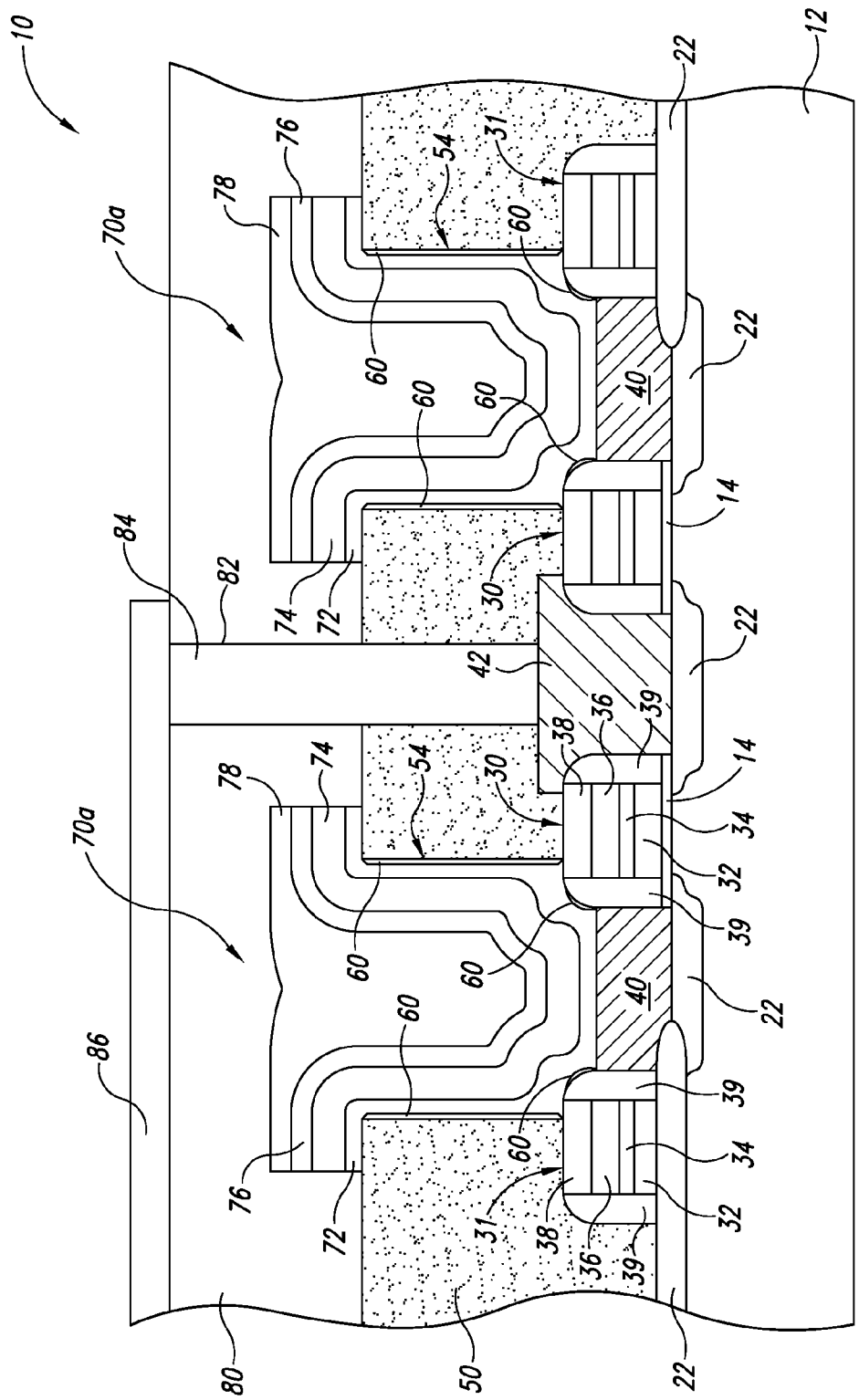
FIG. 5 is a cross-sectional view schematically illustrating an electrical component formed on the microelectronic workpiece of FIG. 4 at a later stage of a method in accordance with an embodiment of the invention.

FIG. 4 is a cross-sectional view of the workpiece 10 in accordance with another embodiment of the invention. The workpiece 10 is substantially similar in FIGS. 1, 2 and 4, and thus like reference numbers refer to like components in these figures. In this example, the underlying layer 60 or liner has been spacer-etched to remove the portions of the underlying layer 60 from horizontal surfaces. As a result, the underlying layer 60 covers the sidewalls 54, and it may cover portions of the spacers 39. Referring to FIG. 5, after etching the underlying layer 60, a plurality of capacitors 70a and other components are formed in a manner similar to the process described above with reference to FIGS. 1 and 2. The expected advantages of the capacitors 70a illustrated in FIG. 5 are accordingly similar to those described above with respect to the capacitors 70 of FIG. 2.

C. Embodiments of Systems

Figure 6:
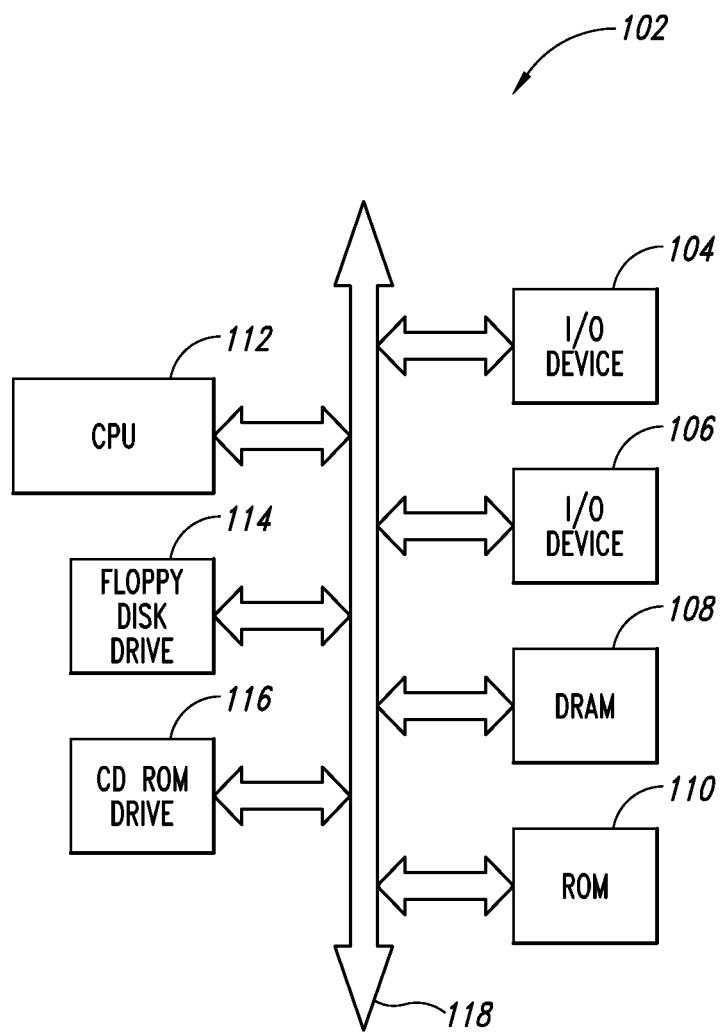
FIG. 6 is a schematic view of a system using a microelectronic device with an electrical component in accordance with an embodiment of the invention.

FIG. 6 is a schematic illustration showing a typical processor-based system 102 including a DRAM device 108 containing a capacitor or other electrical component fabricated according to the embodiments described above. The processor-based system 102, such as a computer system, generally comprises a central processing unit (CPU) 112 that communicates with one or more input/output devices 104 and 106 over a bus 118. The CPU 112 can be a microprocessor or other suitable type of processor. The computer system can also include a read only memory device (ROM) 110, and may include a floppy disk drive 114, a CD-ROM drive 116 that communicates with the CPU 112 over the bus 118, a DVD device, or other peripheral devices. The DRAM device 108 preferably has a stacked capacitor that includes an underlying layer, a first conductive layer on the underlying layer, a dielectric layer on the first conductive layer, and a second conductive layer on the dielectric layer as described above with reference to FIGS. 1-5.

From the foregoing, it will be appreciated that specific embodiments of the invention have been described herein for purposes of illustration, but that various modifications may be made without deviating from the spirit and scope of the invention. For example, the invention is not limited to the specific materials disclosed above, and the invention can include forming components other than capacitors for devices other than DRAM devices. The term "microelectronic device" is used throughout to include other microfeature devices, such as micromechanical devices, data storage elements, read/write components, and other articles of manufacturer. For example, microelectronic devices include SIMM, DRAM, flash-memory, ASICS, processors, imagers, flip-chips, ball-grid array chips, and other types of devices or components. Accordingly, the invention is not limited except as by the appended claims.

We claim:

1. A storage component for a semiconductor device, comprising:
   an electrically conductive material having a first side and a second side opposite the first side;
   a dielectric material contacting at least a portion of the first side of the electrically conductive material, wherein the dielectric material has an initial first dielectric constant before the dielectric material contacts the first side of the electrically conductive material; and
   a liner contacting at least a portion of the second side of the electrically conductive material, wherein the liner increases the dielectric constant of the dielectric material to a second dielectric constant greater than the first dielectric constant,
   wherein the presence of the liner spaced apart from the dielectric material by the electrically conductive material increases the dielectric constant to the second dielectric constant without exposing the dielectric material to an environment above approximately 300° C. after the dielectric material has been positioned on the conductive material.

2. The storage component of claim 1 wherein the dielectric material has a generally amorphous structure associated with the first dielectric constant, and wherein the dielectric material has a generally crystallized structure associated with the second dielectric constant.

3. The storage component of claim 1 dielectric wherein the first dielectric constant is equal to or less than approximately 40, and the second dielectric constant is greater than approximately 40.

4. The storage component of claim 1 wherein the liner comprises at least one of the following: a silicate and an oxide.

5. The storage component of claim 1 wherein the liner comprises at least one of the following: hafnium silicate (HfSi$_x$O$_y$), zirconium silicate (ZrSi$_x$O$_y$), hafnium oxide (HfO$_2$), and hafnium aluminum oxide (HfAl$_x$O$_y$).

6. The storage component of claim 1 wherein the dielectric material comprises tantalum oxide (Ta$_2$O$_5$).

7. The storage component of claim 1 wherein the electrically conductive material comprises at least one of: Ruthenium (Ru), Platinum (Pt), Platinum Rhodium (PtRh), Platinum Iridium (PtIr), Chromium (Cr), Molybdenum (Mo), Rhemium (Re), Iridium (Ir), Titanium (Ti), Tantalum (Ta), Vanadium (V), Niobium (Nb), Tungsten (W) and/or oxides, nitrides, silicides or carbides thereof.

8. A storage component for a semiconductor device, comprising:
   a capacitor having a dielectric layer positioned between a first conductive layer and a second conductive layer, the dielectric layer having an initial first dielectric constant; and
   means for increasing the dielectric constant of the dielectric layer to a second dielectric constant greater than the first dielectric constant without exposing the dielectric layer to an environment above approximately 300° C., wherein the means for increasing the dielectric constant is disposed on at least a portion of the first conductive layer.

9. The storage component of claim 8 wherein the means for increasing the dielectric constant comprises an underlying layer including at least one of the following: a silicate and an oxide.

10. The storage component of claim 8 wherein the dielectric layer has an initial generally amorphous structure, and wherein the means for increasing the dielectric constant at least partially crystallizes the generally amorphous structure such that the dielectric layer has the second dielectric constant.

11. The storage component of claim 8 wherein the first dielectric constant is equal to or less than approximately 40, and the second dielectric constant is greater than approximately 40.

12. The storage component of claim 8 wherein the means for increasing the dielectric constant comprises an underlying layer including at least one of the following: hafnium silicate (HfSi$_x$O$_y$), zirconium silicate (ZrSi$_x$O$_y$), hafnium oxide (HfO$_2$), and hafnium aluminum oxide (HfAl$_x$O$_y$).

13. The storage component of claim 8 wherein the dielectric layer comprises tantalum oxide (Ta$_2$O$_5$).

14. The storage component of claim 8 wherein each of the first conductive layer and the second conductive layer comprises at least one of: Ruthenium (Ru), Platinum (Pt), Platinum Rhodium (PtRh), Platinum Iridium (PtIr), Chromium (Cr), Molybdenum (Mo), Rhemium (Re), Iridium (Ir), Titanium (Ti), Tantalum (Ta), Vanadium (V), Niobium (Nb), Tungsten (W) and/or oxides, nitrides, silicides or carbides thereof.

* * * * *